United States Patent [19]

Imai

[11] Patent Number: 5,111,041
[45] Date of Patent: May 5, 1992

[54] MEANS FOR SECURING A PHOTODETECTOR TO A BASE PLATE OR THE LIKE

[75] Inventor: Hitoshi Imai, Amagasaki, Japan

[73] Assignee: Mitsubishi Denki Kabushiki Kaisha, Tokyo, Japan

[21] Appl. No.: 654,506

[22] Filed: Feb. 13, 1991

[30] Foreign Application Priority Data

Feb. 16, 1990 [JP] Japan ................. 2-15107[U]

[51] Int. Cl.⁵ .............................................. H05K 7/12
[52] U.S. Cl. ..................................... 250/239; 250/216
[58] Field of Search ................................. 250/239, 216

[56] References Cited

U.S. PATENT DOCUMENTS 4,581,657 4/1986 Takano ................................. 358/285
4,861,139 8/1989 Andou et al. ....................... 350/255

FOREIGN PATENT DOCUMENTS 61-131238  6/1986 Japan .
61-230632 10/1986 Japan .
62-080839  4/1987 Japan .
62-173862  7/1987 Japan .
63-122023  5/1988 Japan .
63-268130 11/1988 Japan .
 1-133012  5/1989 Japan ................................... 250/239
 1-269233 10/1989 Japan .

*Primary Examiner*—Constantine Hannaher
*Attorney, Agent, or Firm*—Wolf, Greenfield & Sacks

[57] ABSTRACT

A photodetector fixing mechanism for fixing a photodetector, which detects reflected beams from a recording medium, on a base plate with screws wherein caul portions integrally formed with the base plate sandwich a mounting member mounted with the positioned photodetector with the base plate to prevent the mounting member from being in contact with the screw heads so as not to cause skid of the mounting member by turns of the screws.

19 Claims, 2 Drawing Sheets

MEANS FOR SECURING A PHOTODETECTOR TO A BASE PLATE OR THE LIKE

BACKGROUND OF THE INVENTION

1. Field of the Invention

The present invention relates to a mechanism for fixing a photodetector for detecting reflected beams from a recording medium on a base plate.

2. Description of Related Art

FIG. 1 is a perspective view showing disassembled parts of the conventional mechanism for fixing a photodetector disclosed in, for example, the Japanese Patent Laid-Open Gazette No. 230632 (1986).

In the drawing, reference numeral 1 designates a mounting member for fixing a photodetector 1A to a base plate 2. At both the lateral ends of the base plate 2 are provided threaded bores 4a, 4b where two screws 5a, 5b for fixing the mounting member 1 to the base plate 2 are to be screwed. At the central portion of the base plate 2 is provided a guiding hole 7 for guiding the reflected light flux 6 to the photodetector 1A from a recording medium (not shown). The mounting member 1 has through bores 3a, 3b through which the screws 5a, 5b perforate, respectively, being provided at the positions corresponding to the respective threaded bores 4a and 4b.

Next, how to fix the photodetector 1A to the base plate 2 by the mounting member 1.

The photodetector 1A is temporarily disposed by being mounted on the mounting member 1. The reflected light flux 6 reflected from a recording medium passes through the guiding hole 7 at the base plate 2 to reach the photodetector 1A. The reflected light flux 6 from the recording medium includes the servo information and the reproduced information. In order to obtain with accuracy the servo information or reproduced information, the position of the photodetector 1A is finely adjusted. The screws 5a, 5b are screwed up in the threaded bores 4a, 4b at the base plate 2 through the through bores 3a, 3b at the mounting member 1, respectively thereby fixing the photodetector 1A to the base plate 2.

When the friction coefficient between the base plate 2 and the mounting member 1 is represented by $\mu 1$ and that between the mounting member 1 and the heads of the screws 5a, 5b by $\mu 2$, and when $\mu 1$ and $\mu 2$ satisfy the following inequality:

$$\mu 1 > \mu 2 \qquad (1)$$

the heads of the screws 5a and 5b tighten the mounting member 1 while sliding thereon. On the other hand, since the mounting member 1 does not slide against the base plate 2, the photodetector 1A is not shifted.

However, the friction coefficients $\mu 1$ and $\mu 2$ largely depend on the surface condition, whereby they do not inevitably satisfy the inequality (1).

In a case where engineering plastics, such as PPS (Poly Phenylene Sulfide), is used as material of mounting member 1, the friction coefficient of PPS is generally smaller to an extent of being usable as a base plate substitute for fluoroplastics, whereby a slight variation in the surface condition results in the inequality (1) not being satisfied.

The conventional photodetector fixing mechanism constructed as above-mentioned has the problem that, when the friction coefficient $\mu 1$ is smaller than $\mu 2$, the mounting member 1 slides against the base plate 2 during fixing the mounting member 1, whereby the positioned photodetector 1A may be shifted due to turns of the screws 5a, 5b.

SUMMARY OF THE INVENTION

The present invention has been designed in order to solve the above problem.

A main object of the present invention is to provide a photodetector fixing mechanism which prevents a mounting member from shifting due to turns of screws when the mouting member mounted with a photodetector is fixed to a base plate by the screws.

The above and further objects and features of the invention will more fully be apparent from the following detailed description with accompanying drawings.

DESCRIPTION OF THE PREFERRED EMBODIMENTS

Figure 1:
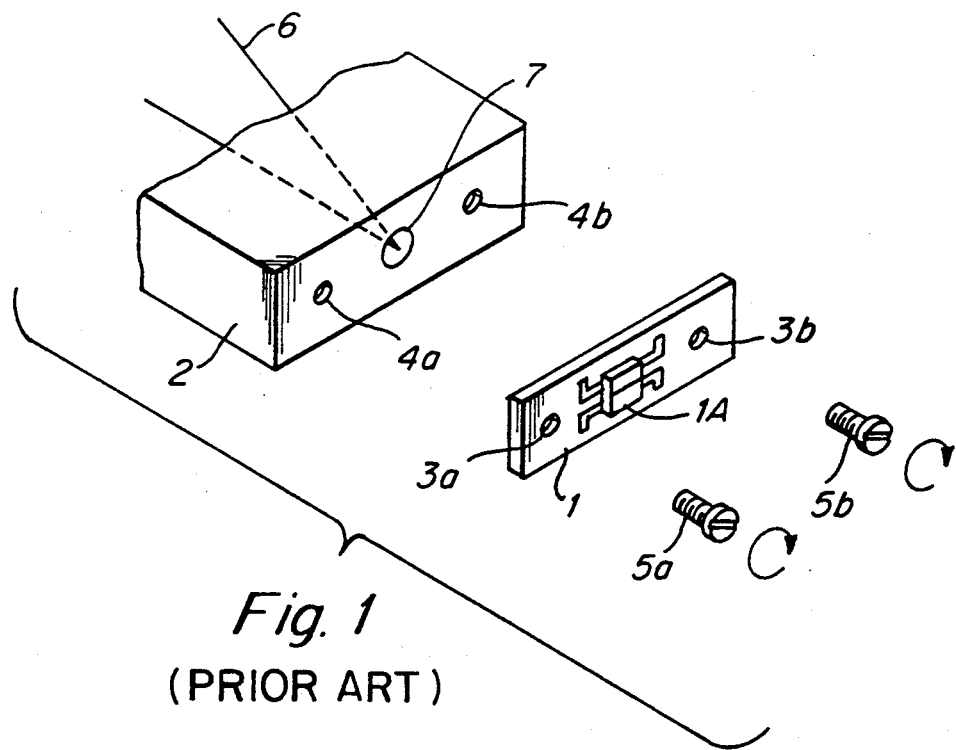
FIG. 1 is a perspective view showing disassembled parts of the conventional photodetector fixing mechanism.
Figure 2:
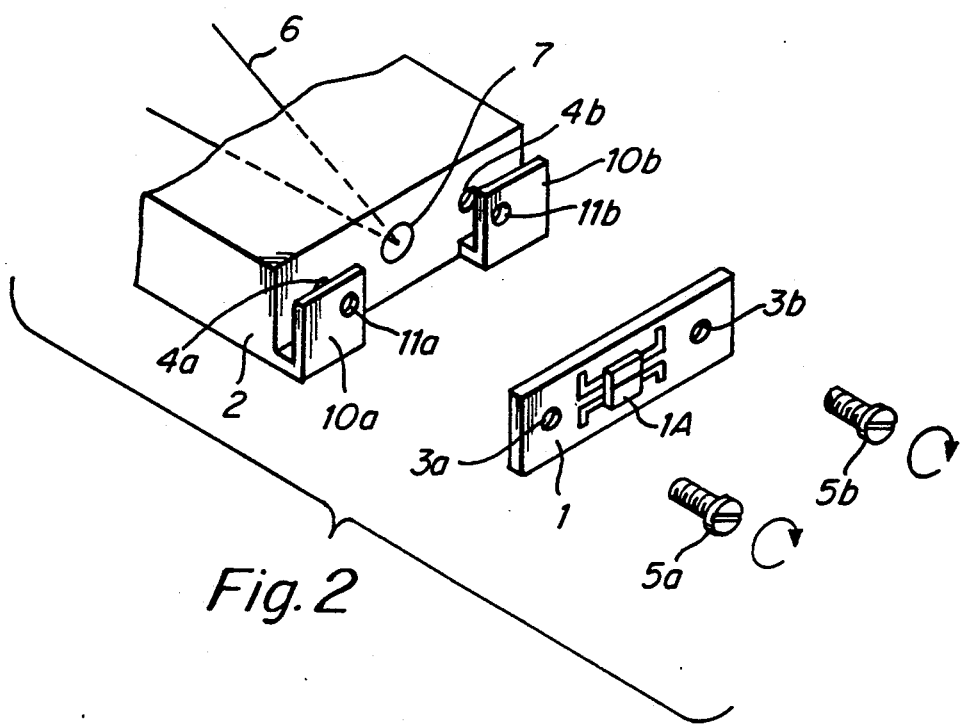
FIG. 2 is a perspective view showing disassembled parts of a photodetector fixing mechanism of the present invention.
Figure 3:
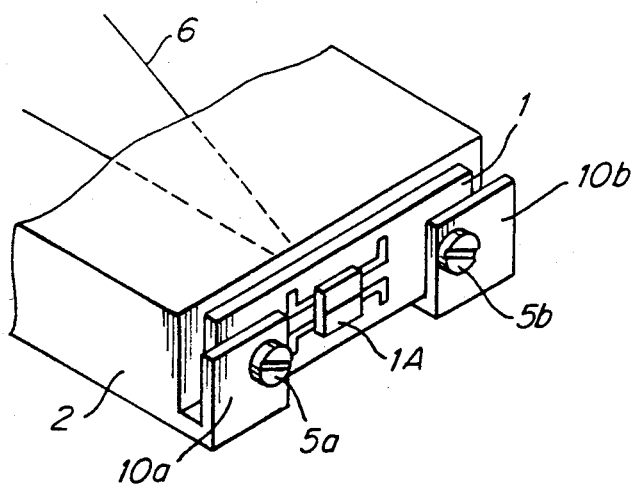
FIG. 3 is a perspective view of the photodetector fixing mechanism of the invention in the state of fixing a photodetector to a base plate.

Next, explanation will be given on a photodetector fixing mechanism of the prevent invention in accordance with the drawings.

In the drawings, reference numeral 1 designates a mounting member for fixing a photodetector 1A to a base plate 2. At both the lateral ends of the base plate 2 are provided threaded bores 4a, 4b where two screws 5a, 5b for fixing the mounting member 1 to the base plate 2 are to be screwed. The mounting member 1 has through bores 3a, 3b through which the screws 5a, 5b are to perforate, respectively being provided at the positions corresponding to threaded bores 4a, 4b. At the central portion of the base plate 2 is provided a guiding hole 7 for guiding the reflected light flux 6 to the photodetector 1A from a recording medium (not shown).

In front of the threaded bores 4a, 4b at the base plate 2 are integrally formed therewith caul portions 10a, 10b covering the threaded bores 4a, 4b supported by arm portions which project forwardly from both ends of the lower edge of the base plate 2 so as to keep an interval somewhat greater than a thickness of the mounting member 1 between each caul portion and the base plate 2. The caul portions 10a, 10b are provided at the positions corresponding to the threaded bores 4a and 4b with through bores 11a, 11b through which the screws 5a, 5b perforate. The caul portions 10a, 10b bend toward the base plate 2 by being subjected to an external pressure to other caul portions in the direction of the thickness thereof, but scarcely deform against a force laterally applied to the caul portions.

Next, how to fix the photodetector 1A to the base plate 2 by the mounting member 1 will be explained. The photodetector 1A is temporarily disposed to the base plate 2 by being mounted on the mounting member 1. The mounting position of the photodetector 1A is finely adjusted so that the reflected light flux 6 reflected from a recording medium is incident with accuracy on the photodetector 1A. Thereafter the screws 5a, 5b are screwed in the threaded bores 4a, 4b at the base plate 2 through the through bores 11a, 11b at the caul portions 10a, 10b and through bores 3a, 3b at the mounting member 1, thereby fixing the mounting member 1 to the base plate 2 applying the caul portions 10a, 10b pressed to the mounting member 1 by the screws 5a, 5b.

Figure 4A:
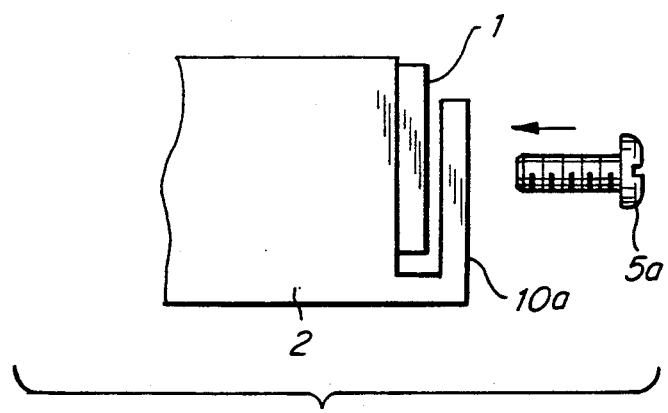
FIG. 4(a) is a side view prior to fixing the photodetector to the base plate by the photodetector fixing mechanism of the invention.
Figure 4B:
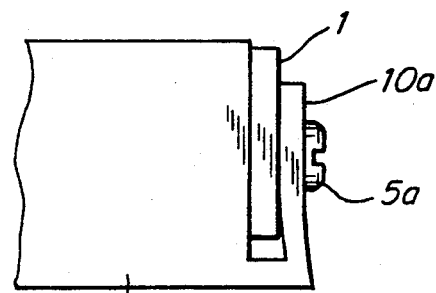
FIG. 4(b) is a side view of the process after fixing the photodetector of the base plate by the photodetector fixing mechanism of the invention.

FIG. 4(a) and 4(b) are consecutive side views of the process of disposing the mounting member 1 on the base plate 2. As shown in FIG. 4(a), after the position of the mounting member 1 is completely adjusted, the screw 5a is inserted into the through bore 11a at the caul portion 10a and through bore 3a at the mounting member 1 and then tightened. The caul portion 10a is deformed by being pushed by the head of the screws 5a and lastly pressed onto the mounting member 1 as shown in FIG. 4(b).

At this time, a sideslipping force is generated by turns of the screw 5a due to friction between the screw head and the caul portion 10a, but since the caul portion 10a and base plate 2 are formed integrally lateral deviation of the caul portion 10a is negligibly small. Accordingly, the sideslipping force is not transmitted to the mounting member 1, so that the mounting member 1 is not shifted from the completely adjusted position thereby being fixed is the optimum position.

Alternatively, even when the photodetector 1A is integrally formed with the mounting member 1, the invention can obtain the same effect as the aforesaid embodiment.

Alternatively, the through bores 3a, 3b may be formed in any shape and may also be replaced by cutouts through which the screws are passable.

As this invention may be embodied in several forms without departing from the spirit of essential characteristics thereof, the present embodiment is therefore illustrative and not restrictive, since of the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. A photodetector fixing mechanism for fixing a photodetector to a base plate by screws screwed in threaded bores at said base plate, comprising;
   a mounting member for fixing the photodetector to said base plate, having bores provided at the position corresponding to said threaded bores, through which said screws perforate respectively; and
   said base plate having at least two caul portions, arm portion means for securing each caul portion from said base plate at greater intervals than a thickness of said mounting member and having bores through which said screws perforate respectively,
   said arm portion means also for securing each caul portion in lateral relationship to one another to provide a space for accommodating the photodetector,
   said caul portions being deformable toward said base plate by pressure applied to said caul portions from the exterior.

2. A photodetector fixing mechanism according to claim 1, wherein said mounting member is integrally formed with said photodetector.

3. A photodetector fixing mechanism according to claim 1, wherein said bores as said mounting member are cutouts respectively.

4. A photodetector fixing mechanism according to claim 1, wherein said bores at said caul portions are cutouts respectively.

5. A photodetector fixing mechanism according to claim 1, wherein said arm portion means and said caul portions are orthogonally related.

6. A photodetector fixing mechanism according to claim 1, wherein each said caul portion assuming one of two different positions including a free position in which the mounting member is freely disposable therein and in which the caul portion is spaced a first predetermined distance from a front wall of said base plate, and an engaging position in which the screws engage and deflect said caul portion into firm engagement with said mounting member and in which the caul portion is spaced closer than said first predetermined distance from said front wall.

7. A photodetector fixing mechanism according to claim 1, wherein each said caul portion and its associated arm portion means are formed as a single unit with said base plate extending from a front wall thereof.

8. A photodetector fixing mechanism for fixing a photodetector to a housing by screws screwed in threaded bores at said housing, comprising;
   a mounting member for fixing the photodetector to said housing, having bores provided at the position corresponding to said threaded bores, through which said screws perforate respectively; and
   said housing being formed from a single unit comprising a base plate, arm portion means, and at least two caul portions,
   said arm portion means for extending said caul portions from said base plate at greater intervals than a thickness of said mounting member and having bores through which said screws perforate respectively,
   said caul portions being deformable toward said base plate by pressure applied to said caul portions from the exterior.

9. A photodetector fixing mechanism according to claim 8 wherein said arm portion means also secure each caul portion to said base plate in lateral relationship to one another and disposed so as to provide a space for accommodating the photodetector.

10. A photodetector fixing mechanism according to claim 9, wherein said arm portion means and said caul portions are orthogonally related.

11. A photodetector fixing mechanism according to claim 8, wherein each said caul portion assuming one of two different positions including a free position in which the mounting member is freely disposable therein and in which the caul portion is spaced a first predetermined distance from a front wall of said base plate, and an engaging position in which the screws engage and deflect said caul portion into firm engagement with said mounting member and in which the caul portion is spaced closer than said first predetermined distance from said front wall.

12. A photodetector fixing mechanism for fixing a photodetector to a base plate by screws screwed in threaded bores at said base plate, comprising;
   a mounting member for fixing the photodetector to said base plate, having bores provided at the position corresponding to said threaded bores, through which said screws perforate respectively; and
   said base plate having a front surface from which at least two caul portions permanently extend by means of arm portions and said caul portions are spaced from said base plate at greater intervals than a thickness of said mounting member from said base plate and having bores through which said screws perforate respectively,
   said caul portions being deformable toward said base plate by pressure applied to said caul portions from the exterior.

13. A photodetector fixing mechanism according to claim 12 wherein said arm portions secure each caul portion to said base plate in lateral relationship to one another and disposed so as to provide a space for accommodating the photodetector.

14. A photodetector fixing mechanism according to claim 13, wherein said arm portions and said caul portions are orthogonally related.

15. A photodetector fixing mechanism according to claim 12, wherein each said caul portion assuming one of two different positions including a free position in which the mounting member is freely disposable therein and in which the caul portion is spaced a first predetermined distance from a front wall of said base plate, and an engaging position in which the screws engage and deflect said caul portion into firm engagement with said mounting member and in which the caul portion is spaced closer than said first predetermined distance from said front wall.

16. A photodetector fixing mechanism for fixing a photodetector to a base plate comprising;
   said base plate and at least one caul portion, arm portion means securing said caul portion along one edge in spaced parallel relation to one side of said base plate defining a channel,
   a mounting member to which a photodetector is secured, positioned in said channel with the width of said channel greater than said mounting member, and
   screw means threaded through said caul portion and mounting member into said base to deform said caul portion into facing engagement with said mounting means.

17. A photodetector fixing mechanism for fixing a photodetector to a base plate by screws screwed in threaded bores at said base plate, comprising;
   a mounting member for fixing the photodetector to said base plate, having bores provided at the position corresponding to said threaded bores, through which said screws perforate, respectively;
   said base plate having a mounting surface, at least two caul portions, and respective arm portions for securing said caul portions from the base plate mounting surface and disposed in a plane substantially parallel to the mounting surface but spaced therefrom a distance greater than the thickness of the mounting member and having respective bores through which said screws perforate; and
   said arm portions respectively supporting said caul portions and spaced relative lateral position so as to provide a space therebetween for accommodating the photodetector.

18. A photodetector fixing mechanism according to claim 17, wherein said arm portions are disposed from said caul portions so that said caul portions have at least two positions of placement relative to said base plate mounting surface including a free position in which said caul portions are spaced a first distance from said mounting surface so as to readily accommodate said mounting member, and a clamping position in which said caul portions are drawn into engagement with said mounting member and are disposed spaced a second distance less than said first distance from said mounting surface.

19. A photodetector fixing mechanism according to claim 17, wherein said arm portions are disposed from said mounting surface at a position remote from said base plate bores.

* * * * *